United States Patent [19]

Ishida et al.

[11] Patent Number: 5,450,101
[45] Date of Patent: Sep. 12, 1995

[54] THERMAL HEAD FOR A PRINTER

[75] Inventors: Yuichi Ishida; Yoshiaki Saita; Norimitsu Sanbongi; Noriyoshi Shoji; Yoshinori Sato; Osamu Takizawa, all of Tokyo, Japan

[73] Assignee: Seiko Instruments Inc., Japan

[21] Appl. No.: 273,633

[22] Filed: Jul. 12, 1994

[30] Foreign Application Priority Data

Jul. 22, 1993 [JP] Japan .................. 5-181517

[51] Int. Cl.⁶ .............................................. B41J 2/335
[52] U.S. Cl. ...................................................... 347/200
[58] Field of Search ...................................... 346/76 PH

[56] References Cited

U.S. PATENT DOCUMENTS 5,278,580 1/1994 Nishikawa et al. ............ 346/76 PH

FOREIGN PATENT DOCUMENTS 0115447 9/1990 Japan .

Primary Examiner—Huan H. Tran
Attorney, Agent, or Firm—Adams & Wilks

[57] ABSTRACT

A circuit terminal of a thermal head substrate is connected to a flexible printed circuit by an electroconductive adhesive or a solder metal. An overcoating composed of an insulating or extra-low electroconductive material is applied to cover a region containing a connected portion between the circuit terminal and the flexible printed circuit and to cover an exposed portion of the circuit terminal to thereby prevent corrosion of the circuit terminal, improve the mechanical strength of the flexible printed circuit connection, and prevent a short-circuit.

9 Claims, 2 Drawing Sheets

THERMAL HEAD FOR A PRINTER

BACKGROUND OF THE INVENTION

The present invention relates to a printer having a thermal head for acting on a thermally sensitive paper, or for transferring an ink film or the like to a record paper.

Conventionally, as shown in FIG. 4, an FPC (Flexible Printed Circuit) 53 having a circuit pattern 54 on a polymide film is utilized as a connector circuit for leading a circuit terminal 52 formed on a thermal head substrate 51 to an external thermal head control circuit. The FPC 53 is connected to the circuit terminal 52 by soldering or by means of an adhesive 55 having dispersed electroconductive particles in a known thermal head construction.

For example, Japanese Utility Model Application Laid-open No. 2-115447 discloses such a construction of the thermal head where the FPC and the circuit terminal are coupled with each other by adhesive having dispersed electroconductive particles. In such a construction, the adhesive 55 containing the dispersed electroconductive particles or a solder has a function to provide an electrical contact between the circuit terminal 52 and the circuit pattern 54 of the FPC 53, and another function to mechanically fix the FPC 53 and the thermal head substrate 51 with each other. In this case, the circuit terminal 52 is generally formed of a cheap metal film such as aluminum, aluminum alloy and copper. Alternatively, in case of the soldering connection, the circuit terminal 52 has a copper surface or the like of is metalized by nickel in a general structure. On the other hand, in case of the coupling by means of the adhesive containing the dispersed electroconductive particles, as described in the Japanese Utility Model Application Laid-open No. 2-115447, the electroconductive particles dispersed in the adhesive are pressed into the surface of the circuit terminal 52 to provide the electric contact to the circuit pattern of the FPC 53, while the connection is secured and fixed by means of the adhesive. Accordingly, a surface treatment is not required for the circuit terminal 52, and therefore the connecting treatment may be applied directly to the exposed aluminum or copper film.

However, the conventional thermal head having the above described construction has problems as follows.

(1) The circuit terminal 52 of the thermal head substrate 51 has a free noncontact area 52A which is exposed in the vicinity of the contact area to the FPC 53. Further, the exposed area has a surface composed of the circuit terminal materials such as aluminum and copper, or composed of nickel metalization applied to the circuit terminal. These metal materials are quite corrosive when exposed to the atmosphere containing moisture or active gas.

(2) The thermal head substrate 51 and the FPC 53 are overlapped with each other along a narrow width portion where the connection is held by the solder or the adhesive. Accordingly, the connected portion has a rather weak mechanical strength. When an external force is applied to the connected portion, the thermal head may suffer from serious malfunctions such as a crack or peeling at the connected portion.

(3) When a foreign material such as metal chips is dropped onto the exposed noncontact area 52A of the circuit terminal 52, a short-circuit may occur by the foreign material to cause operation failure or mis-operation.

SUMMARY OF THE INVENTION

In view of these problems, an object of the invention is to prevent corrosion of to circuit terminal, the improve mechanical strength of the FPC connection, and to protect a thermal head against a short-circuit. In order to solve the above noted problems, according to the invention the connected portion and an exposed vicinity thereof between the circuit terminal of the thermal head substrate and the FPC or the connector circuit are coated by a material having an electric insulation property, moisture barrier property and an adhesion property, such as silicone resin, epoxy resin and low-melting glass. By coating the connected portion and the exposed portion between one end of the thermal head substrate and another end of the FPC (the connector circuit) with the material having the electric insulation property, moisture barrier property and adhesion property, the exposed area composed of the conductor such as aluminum which constitutes the circuit terminal or composed of the nickel metalization is protected from the ambient atmosphere to thereby prevent penetration of moisture which may cause corrosion as well as to directly suppress corrosion. Further, a foreign material such as metal chips can be prevented from contacting the exposed noncontact area of the circuit terminal to thereby avoid operational failure.

Further, by covering the contacted portion of the circuit terminal and the FPC with the adhesive material, the external force is spread out or absorbed by the adhesive material. Consequently, the connected portion is protected from a directly applied external force. Otherwise, the resin or other material over the connected portion serves as a mechanical reinforcement to improve the mechanical strength of the connection.

DETAILED DESCRIPTION OF EMBODIMENTS

Figure 1:
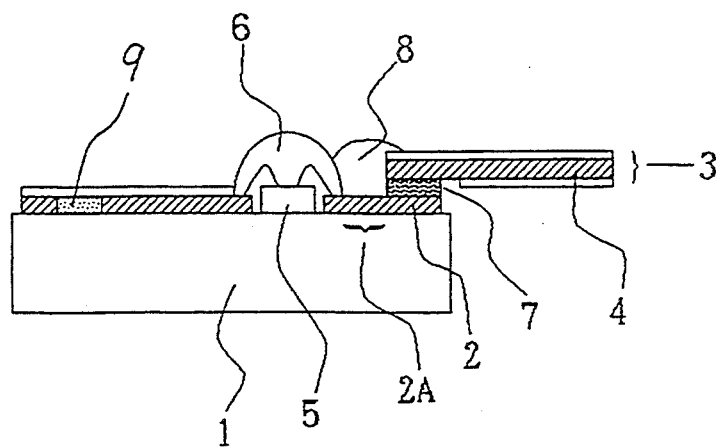
FIG. 1 is a sectional view of a first embodiment of the inventive thermal head.

Embodiment of the present invention will be described in conjunction with the drawings. FIG. 1 is a sectional diagram showing a first embodiment of the thermal head according to the invention. A thermal head substrate 1 mounts thereon a driver IC 5 for switching application of an electric current to thermal resistor elements 9. The driver IC 5 is molded by a molding material 6 such as silicone resin or epoxy resin to entirely cover the driver IC 5.

Further, the thermal head substrate 1 is formed thereon with power supply terminals to apply an electric current to the thermal resistor elements 9 and circuit terminals 2 to input record control data into the driver IC 5. These terminals or pads are formed of electroconductive film such as aluminum metal, aluminum alloy and copper metal. These circuit terminals 2 and circuit patterns 4 or lead patterns formed on an FPC 3 are coupled with each other by means of a heat-curable adhesive 7 containing dispersed electroconductive particles, the adhesive serving both a fixing function and an electric conducting function.

Moreover, an overcoating layer 8 is formed to cover a nonconnected area 2A of each circuit terminal 2, which exists between an edge of the FPC 3 and an end of the molding material 6. The overcoating layer 8 is also applied over the edges of the molding material 6 and the FPC 3 to thereby completely protect the surface of the circuit terminal 2 against the atmosphere.

By such a construction, the circuit terminal 2 is protected from the atmosphere to prevent corrosion. Further, even when an external metal chip or else is dropped onto the exposed portion, short-circuit failure of adjacent circuit terminals can be avoided since they are protectively insulated by the overcoating layer 8. Moreover, an external force applied to the connected portion can be spread onto or adsorbed by the overcoating layer 8 to maintain the coupling strength so as to ensure the mechanical strength of the connected portion to thereby improve the reliability.

The overcoating layer 8 is composed of silicone resin, epoxy resin, low-melting glass and so on. The epoxy resin and the low-melting glass are advantageous in view of moisture barrier property. On the other hand, the silicone resin is advantageous in view of its elastic or soft coverage to avoid application of the excessive stress to the thermal head substrate 1 and the driver IC 5. In this construction, the material and the thickness of the overcoating layer 8 can be determined in taking account of whether the priority is given to the corrosion resistance or the mechanical strength for the improvement of the thermal head characteristics, and in taking account of a bending degree of the thermal head substrate due to the stress of the overcoating layer 8. For example, the thickness of the silicone resin may be set in the range of 0.3 mm–1.5 mm, and the thickness of the epoxy resin may be set in the range of 0.3 mm–0.5 mm to ensure sufficient moisture resistance while the stress can be suppressed to a low level.

On the other hand, if the circuit terminal 2 and the circuit pattern 4 of the FPC 3 are connected to each other by means of solder, the coupling strength is higher than the adhesive connection. Further, the surface of the circuit terminal is generally laminated by an intermediate layer such as a nickel metalization for preventing corrosion. Therefore, an excessive overcoating layer may not be required as compared to the adhesive coupling.

A substrate temperature of the thermal head may rise substantially during the printing operation, thereby creating a considerable temperature difference between a rest state and a working state. Thus, care should be taken to prevent stress from being applied to the connected portion due to thermal expansion and construction, and to prevent peeling along the boundary between the overcoating layer and the thermal head substrate. For example, the epoxy resin may be mixed with a filler having a thermal expansion coefficient comparable to alumina which constitutes the thermal head substrate so as to further improve the reliability. In case of using low-melting glass, the thermal expansion coefficient is also adjusted.

Figure 2:
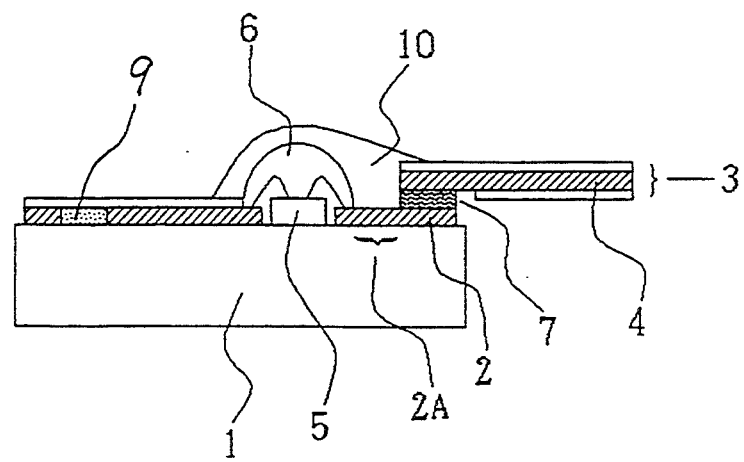
FIG. 2 is a sectional view of a second embodiment of the inventive thermal head.

Next, a second embodiment of the invention will be described in conjunction with the drawings. FIG. 2 is a sectional view of the inventive thermal head. In the figure, a thermal head substrate 1 mounts thereon a driver IC 5 which is molded by a molding resin material 6 in a manner similar to the first embodiment. A circuit terminal 2 on the thermal head substrate 1 and a circuit pattern 4 on an FPC 3 are connected to each other by means of a heat-curable adhesive 7 containing electroconductive particles. An overcoating layer 10 covers a noncontact and exposed portion 2A of the circuit terminal 2 extending between an edge of the FPC 3 and an end of the molding material 6, and also covers the driver IC under the molding material 6. The overcoating layer 10 is composed of epoxy resin Or other hard materials having a small surface friction resistance as well as good insulation, dampproofness and adhesiveness.

Figure 4:
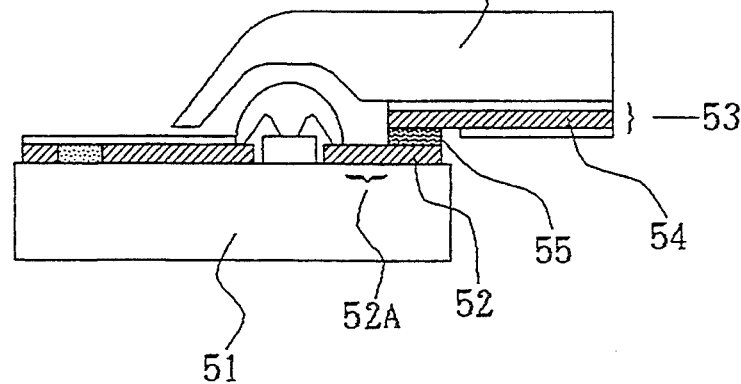
FIG. 4 is a sectional view of a conventional thermal head.

By such a construction, in a manner similar to the first embodiment, the circuit terminal 2 on the thermal head substrate 1 is prevented from exposure to the atmosphere, and the mechanical strength of the connected portion is made high, thereby improving the reliability of the connected portion. Further, by covering the above mentioned region with the hard material having the small surface friction resistance, an IC cover 60 shown in FIG. 4 can be eliminated to thereby reduce the size and the weight of the thermal head device. Further, in case that the overcoating layer 10 may frictionally contact with a recording paper, the overcoating layer 10 can be composed of an epoxy resin containing carbon to provide a slight or quite weak electroconductivity in the order of a relative resistance of $10^7$–$10^{10}$ $\Omega$m so as to gradually release an electrostatic charge generated by the frictional contact with the recording paper, to a power supply line.

However, in case that the control of the thermal head is hindered by directly coating the input terminals of the driver IC by the extra-low electroconductive resin, the overcoating layer 10 may be formed of a laminate structure of an inner insulation coating layer and an outer extra-low electroconductive resin layer. In such a laminate structure or a multi-layer structure, the other layer is made extra-low electroconductive, and this slightly electroconductive coating is electrically connected to a power supply line or a ground line.

Figure 3:
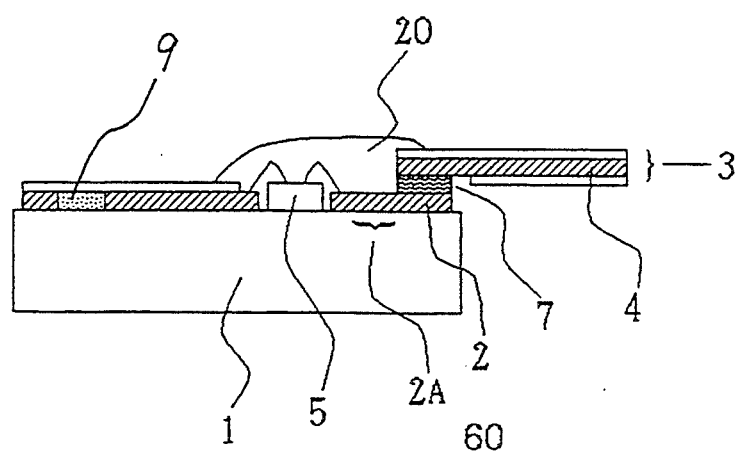
FIG. 3 is a sectional view of a third embodiment of the inventive thermal head.

In contrast to the second embodiment where the overcoating layer 10 is applied separately from the molding material 6 of the driver IC, a third embodiment shown in FIG. 3 eliminates the molding material 6 of the driver IC 5. Only an overcoating layer 20 is applied to mold the driver IC 5. In this case, the overcoating layer 20 is simply formed to protect the driver IC 5.

As described above, in the thermal head where the circuit pattern of the FPC is connected by means of the electroconductive adhesive containing dispersed electroconductive particles or the solder to the circuit terminal formed on the thermal head substrate and composed of cheap but corrosive lead materials such as aluminum metal, aluminum alloy and copper metal, according to the invention the connected portion and an exposed vicinity thereof, between the circuit pattern of the FPC and the circuit terminal of the thermal head substrate is covered by a material having an insulating property, a moisture barrier property and an adhesion property, thereby producing various advantages as follows.

(1). The circuit terminal is not directly exposed to the atmosphere, to thereby suppress corrosion of the circuit terminal under a corrosive ambience.

(2) The overcoating layer is an insulative coating effective to prevent a circuit failure such as short-circuit which would be caused by a foreign material such as metal chips.

(3) The mechanical connecting strength is made higher between the circuit terminal of the thermal head substrate and the circuit pattern of the FPC, thereby improving reliability of the permanent connection against an external force and vibration.

(4) The driver IC is also covered by the protective coating layer to eliminate an IC cover to thereby realize reduction in size and weight of the thermal head device.

What is claimed is:

1. A thermal head for a printer comprising:

thermal resistor elements for recording data on a record medium;

a driver IC for driving the thermal resistor elements according to an inputted drive control signal;

a thermal head substrate for supporting the driver IC and having circuit terminals for transmitting the drive control signal to the driver IC and for supplying power to the driver IC;

a connector circuit having one end electrically connected to an external circuit and another end electrically connected to the circuit terminals formed on the thermal head substrate, the connector circuit being connected to the circuit terminals by an electroconductive adhesive or a solder metal; and an overcoating composed of an insulating material or an extra-low electroconductive material, the overcoating covering a connected portion between the circuit terminals and the connector circuit and covering an exposed portion of the circuit terminals.

2. A thermal head for a printer according to claim 1; including a mold resin for molding the driver IC, wherein the overcoating covers an entire portion of the mold resin as well as the connected portion between the circuit terminals and the connector circuit and the exposed portion of the circuit terminals.

3. A thermal head for a printer according to claim 1; wherein the overcoating covers directly the driver IC as well as the connected portion between the circuit terminals and the connector circuit and the exposed portion of the circuit terminals.

4. A thermal head for a printer according to claim 1; wherein the overcoating is composed of silicone resin.

5. A thermal head for a printer according to claim 4; wherein the overcoating of silicone resin has a thickness in the range of 0.3 mm–1.5 mm.

6. A thermal head for a printer according to claim 1; wherein the overcoating is composed of epoxy resin.

7. A thermal head for a printer according to claim 6; wherein the overcoating of epoxy resin has a thickness in the range of 0.3 mm–0.5 mm.

8. A thermal head for a printer according to claim 1; wherein the overcoating is composed of low-melting glass.

9. A thermal head for a printer according to claim 1; wherein the overcoating is composed of epoxy resin containing carbon, the carbon being present in an amount sufficient to impart a weak electroconductivity to the overcoating.

* * * * *